(12) United States Patent
Hsieh et al.

(10) Patent No.: US 11,543,430 B2
(45) Date of Patent: Jan. 3, 2023

(54) PROBE ASSEMBLY

(71) Applicant: MPI Corporation, Hsinchu County (TW)

(72) Inventors: Ming-Hsiang Hsieh, Hsinchu County (TW); Chia-Nan Chou, Hsinchu County (TW); Hao Wei, Hsinchu County (TW); Chia-Jung Liu, Hsinchu County (TW); Chia-An Yu, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 0 days.

(21) Appl. No.: 17/469,412

(22) Filed: Sep. 8, 2021

(65) Prior Publication Data

US 2022/0074970 A1 Mar. 10, 2022

(30) Foreign Application Priority Data

Sep. 9, 2020 (TW) .................................. 109131000

(51) Int. Cl.
*G01R 1/067* (2006.01)

(52) U.S. Cl.
CPC ..... *G01R 1/06722* (2013.01); *G01R 1/06761* (2013.01)

(58) Field of Classification Search
CPC .................. G01R 1/06722; G01R 1/06761
See application file for complete search history.

(56) References Cited

U.S. PATENT DOCUMENTS

| 4,697,143 | A | * | 9/1987 | Lockwood | G01R 1/06772 324/762.05 |
|---|---|---|---|---|---|
| 4,894,612 | A | * | 1/1990 | Drake | G01R 1/07342 324/755.07 |
| 5,508,630 | A | * | 4/1996 | Klemer | G01R 1/06772 324/755.07 |
| 5,561,378 | A | * | 10/1996 | Bockelman | G01R 1/06772 324/762.01 |
| 10,852,322 | B1 | * | 12/2020 | Rosas | G01R 1/06772 |
| 2007/0222468 | A1 | * | 9/2007 | McTigue | G01R 1/06772 324/755.07 |
| 2008/0048796 | A1 | * | 2/2008 | Shaul | H01P 3/003 333/4 |
| 2012/0187970 | A1 | * | 7/2012 | Saunders | G01R 1/07342 257/E21.531 |
| 2020/0057094 | A1 | * | 2/2020 | Swaim | H05K 1/113 |

* cited by examiner

*Primary Examiner* — Paresh Patel
(74) *Attorney, Agent, or Firm* — Birch, Stewart, Kolasch & Birch, LLP

(57) ABSTRACT

A probe assembly, adapted to test high-speed signal transmission lines of printed circuit boards, includes two pogo pins for providing high-frequency differential test signals, and both sides of the pogo pin include no metal layer (grounding layer). Experiments have found that when the two pogo pins test a to-be-tested object, the test signal will be coupled to the metal layers on both sides of the pogo pins to generate a radiation resonance, resulting in a loss of the test signal on a specific frequency band, and further reducing the effective bandwidth of the probe assembly. The metal layers on both sides of the pogo pins of the probe assembly are reduced, so that the foregoing radiation resonance phenomenon can be avoided.

10 Claims, 10 Drawing Sheets

PROBE ASSEMBLY

CROSS-REFERENCE TO RELATED APPLICATION

This non-provisional application claims priority under 35 U.S.C. § 119(a) to Patent Application No. 109131000 in Taiwan, R.O.C. on Sep. 9, 2020, the entire contents of which are hereby incorporated by reference.

BACKGROUND

Technical Field

The present invention relates to a probe assembly, and in particular, to a probe assembly applied to perform a high-speed differential signal test.

Related Art

A conventional probe structure for measuring a differential signal includes multiple probes disposed on a printed circuit board, and probe arrangement manners of the probe structure are GSS, SSG, SGS, GSSG and GSGSG, where G represents a grounding probe, and S represents a signal probe. Accompanied with more compact and diversified wiring and layout design of a printed circuit board, a form in which test contacts of a to-be-tested object include no grounding point may come out in the future, resulting in that the foregoing probe structure including grounding probes cannot be used. In other words, there is no design scheme for the probe based on an SS architecture in the prior art.

SUMMARY

In view of this, the present invention provides a probe assembly, including a dielectric layer, a first signal line, a second signal line, a first pogo pin, a second pogo pin, a first upper grounding layer, a second upper grounding layer, and a lower grounding layer.

The dielectric layer includes an upper surface, a lower surface, a first side, a second side, and a third side, where the first side and the second side are opposite to each other, and the third side is located between the first side and the second side. The upper surface of the dielectric layer includes a first upper blank region, a second upper blank region, a first upper grounding region, and a second upper grounding region, and the lower surface of the dielectric layer includes a first lower blank region and a second lower blank region. The first signal line is disposed on the upper surface of the dielectric layer, where the first signal line includes a first head section and a first tail section, one end of the first head section is connected to the first tail section, and an other end of the first head section points to the third side. The first upper blank region and the first lower blank region are located between the first head section and the first side. The first upper grounding region is located between the first tail section and the first side. The second signal line is disposed on the upper surface of the dielectric layer and is spaced apart from the first signal line. The second signal line includes a second head section and a second tail section, one end of the second head section is connected to the second tail section, and an other end of the second head section points to the third side. The second upper blank region and the second lower blank region are located between the second head section and the second side. The second upper grounding region is located between the second tail section and the second side. The first pogo pin is disposed at the first head section. The second pogo pin is disposed at the second head section. The first upper grounding layer is disposed in the first upper grounding region, the second upper grounding layer is disposed in the second upper grounding region, and the lower grounding layer is disposed on the lower surface of the dielectric layer without passing through the first lower blank region and the second lower blank region.

The present invention further provides a probe assembly, including a dielectric layer, a first signal line, a second signal line, a first pogo pin, a second pogo pin, an upper grounding layer, and a lower grounding layer. The dielectric layer includes a body portion and a protruding portion, where the protruding portion protrudes from one side of the body portion in a first direction toward a direction away from the side. The first signal line is disposed on the upper surface of the dielectric layer, and the first signal line includes a first head section and a first tail section, where the first head section is disposed at the protruding portion, the first tail section is disposed at the body portion. One end of the first head section is connected to the first tail section, and an other end of the first head section points to an end surface of the protruding portion. The second signal line is disposed on the upper surface of the dielectric layer and is spaced apart from the first signal line. The second signal line includes a second head section and a second tail section, where the second head section is disposed at the protruding portion of the dielectric layer, and the second tail section is disposed at the body portion of the dielectric layer. One end of the second head section is connected to the second tail section, and an other end of the second head section points to an end surface of the protruding portion. The first pogo pin is disposed at the first head section. The second pogo pin is disposed at the second head section. The upper grounding layer is disposed on the upper surface of the body portion of the dielectric layer, and the lower grounding layer is disposed on the lower surface of the body portion and the lower surface of the protruding portion of the dielectric layer.

One of the features of the present invention is including no grounding probe, thereby being applied to a to-be-tested device of which test contacts include no grounding point. Another feature of the present invention is that the grounding layers (metal layers) on both sides of the pogo pin are reduced, so that during the test, a test signal will not be coupled to the grounding layers on both sides and generate a radiation resonance to reduce an effective bandwidth of the probe assembly.

DETAILED DESCRIPTION

Figure 1:
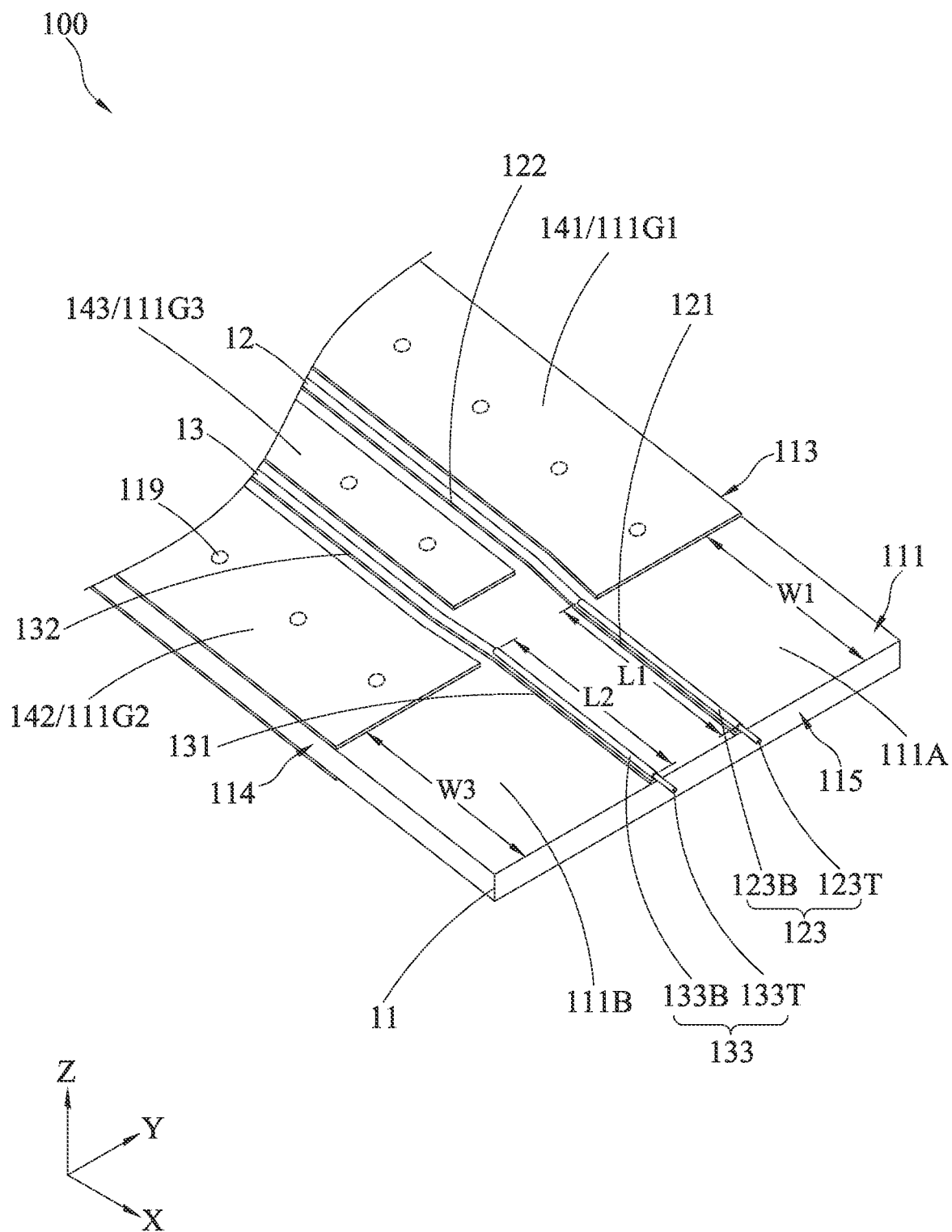
FIG. 1 is a schematic perspective view (I) according to a first embodiment of the present invention.

In the specification and the scope of the patent application of the present invention, "up" or "down" is merely used to illustrate an orientation shown in the drawings, and do not limit an actual orientation.

A relative size and a thickness of each assembly in the drawings are merely an example, and do not limit an actual relative size relationship of each assembly.

Figure 2:
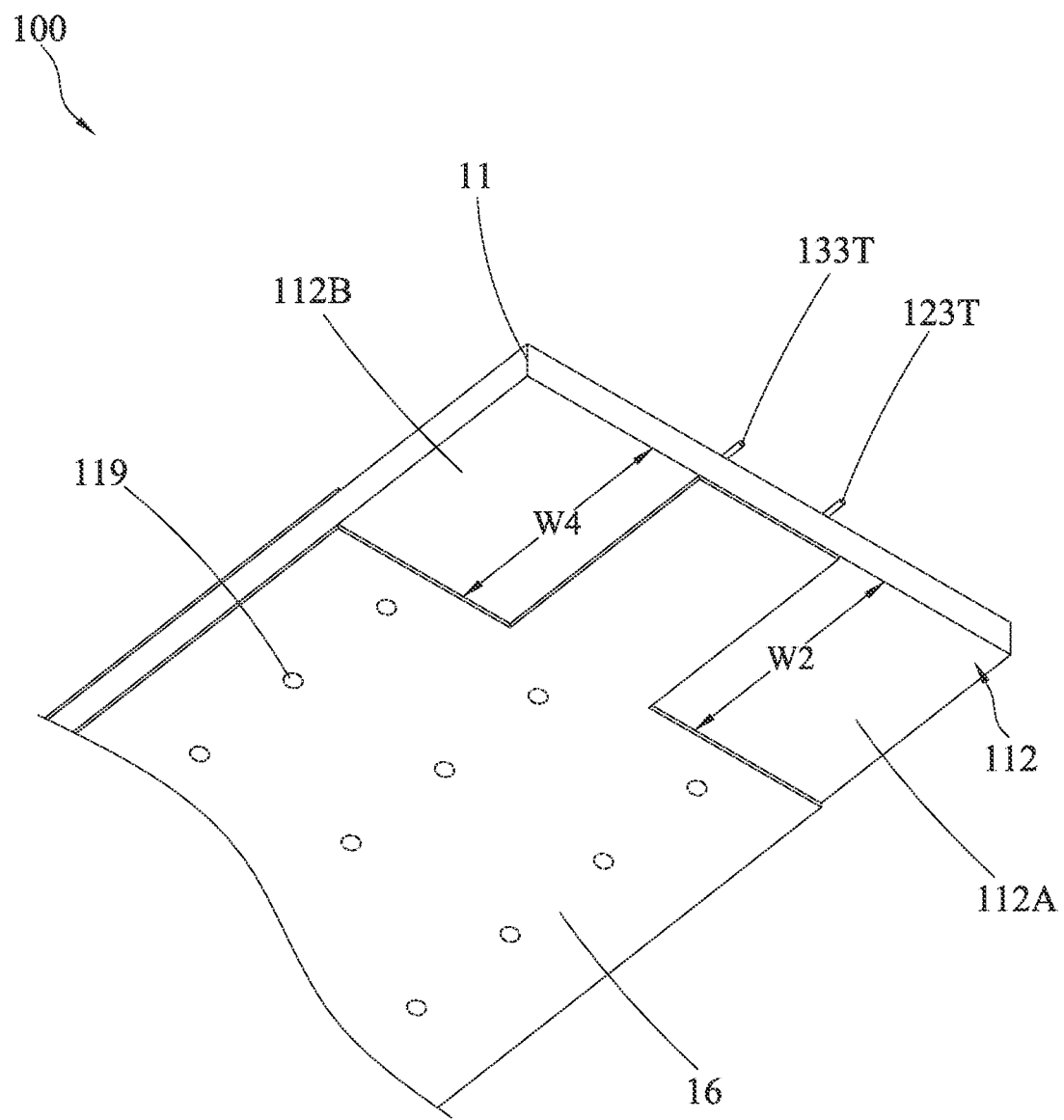
FIG. 2 is a schematic perspective view (II) according to a first embodiment of the present invention.

FIG. 1 and FIG. 2 are respectively a schematic perspective view (I) and a schematic perspective view (II) according to a first embodiment of the present invention, which illustrate a probe assembly 100. The probe assembly 100 includes a dielectric layer 11, a first signal line 12, a second signal line 13, a first pogo pin 123, a second pogo pin 133, a first upper grounding layer 141, a second upper grounding layer 142, and a lower grounding layer 16. The probe assembly 100 is applicable to perform a differential signal test on high-speed signal transmission lines of a printed circuit board, and is particularly applicable to a printed circuit board of which test contacts include no grounding point.

The dielectric layer 11 includes an upper surface 111, a lower surface 112, a first side 113, a second side 114, and a third side 115, where the first side 113 and the second side 114 are opposite to each other, the third side 115 is located between the first side 113 and the second side 114. The upper surface 111 of the dielectric layer 11 includes a first upper blank region 111A, a second upper blank region 111B, a first upper grounding region 111G1, and a second upper grounding region 111G2. The lower surface 112 of the dielectric layer 11 includes a first lower blank region 112A and a second lower blank region 112B.

The first signal line 12 is disposed on the upper surface 111 of the dielectric layer 11, where the first signal line 12 includes a first head section 121 and a first tail section 122. One end of the first head section 121 is connected to the first tail section 122, and an other end of the first head section 121 points to the third side 115. The first upper blank region 111A and the first lower blank region 112A are located between the first head section 121 and the first side 113. Further, the first lower blank region 112A is disposed on the lower surface 112 and corresponds to the first upper blank region 111A of the upper surface 111, that is, the first lower blank region 112A is disposed on the lower surface 112 and corresponds to a position between the first head section 121 and the first side 113 of the upper surface 111. The first upper grounding region 111G1 is located between the first tail section 122 and the first side 113 of the dielectric layer 11, and the first upper grounding layer 141 is disposed in the first upper grounding region 111G1.

The second signal line 13 is disposed on the upper surface 111 of the dielectric layer 11 and is spaced apart from the first signal line 12. The second signal line 13 includes a second head section 131 and a second tail section 132, where one end of the second head section 131 is connected to the second tail section 132, and an other end of the second head section 131 points to the third side 115. The second upper blank region 111B and the second lower blank region 112B are located between the second head section 131 and the second side 114. Further, the second lower blank region 112B is disposed on the lower surface 112 and corresponds to the second upper blank region 111B of the upper surface 111, that is, the second lower blank region 112B is disposed on the lower surface 112 and corresponds to a position between the second head section 131 and the second side 114 of the upper surface 111. The second upper grounding region 111G2 is located between the second tail section 132 and the second side 114, and the second upper grounding layer 142 is disposed in the second upper grounding region 111G2.

The first pogo pin 123 is disposed at the first head section 121 of the first signal line 12. In some embodiments, the first pogo pin 123 is disposed at the first head section 121 of the first signal line 12 in a manner of soldering and welding. The first pogo pin 123 includes a pin body portion 123B and a telescopic portion 123T, where the telescopic portion 123T is located at one end of the pin body portion 123B, and the telescopic portion 123T protrudes from the third side 115 of the dielectric layer 11 in a free state. The second pogo pin 133 is disposed at the second head section 131 of the second signal line 13. In some embodiments, the second pogo pin 133 is disposed at the second head section 131 of the second signal line 13 in the manner of soldering and welding. The second pogo pin 133 includes a pin body portion 133B and a telescopic portion 133T, where the telescopic portion 133T is located at one end of the pin body portion 133B, and the telescopic portion 133T protrudes from the third side 115 of the dielectric layer 11 in the free state. During the test, the telescopic portion 123T of the first pogo pin 123 and the telescopic portion 133T of the second pogo pin 133 respectively contact two differential signal test contacts of a to-be-tested device, in which way a differential test signal is transmitted to the to-be-tested device to test the to-be-tested device. In some embodiments, the telescopic portion 123T and the telescopic portion 133T protrude from the third side 115 of the dielectric layer 11 in the free state. However, the telescopic portion 123T is located at one end of the pin body portion 123B, and the telescopic portion 133T is located at a position where the pin body portion 133B is disposed, which can be trimmed flush with the third side 115 of the dielectric layer 11, or can be disposed on the upper surface 111 of the dielectric layer 11 without being trimmed flush with the third side 115, or can be disposed outside of the third side 115 and protruding from the third side 115, which is not limited thereto. That is, the telescopic portion 123T is located at one end of the pin body portion 123B, and the telescopic portion 133T is located at a position where the disposed position of the pin body portion 133B is opposite to the third side 115, where one end of the pin body portion 123B and the pin body portion 133B are trimmed flush with the third side 115, or positioned at one end of the third side 115 that is toward or away from the upper surface 111 of the dielectric layer 11, which is not limited thereto.

The lower grounding layer 16 is disposed on the lower surface 112 of the dielectric layer 11 and may cover an area outside of the first lower blank region 112A and the second lower blank region 112B of the lower surface 112. It should be particularly noted herein that the lower grounding layer 16 may cover lower portions of the pin body portion 123B of the first pogo pin 123 and the pin body portion 133B of the second pogo pin 133, that is, may cover a portion between the first lower blank region 112A and the second lower blank region 112B. In this way, impedance matching of the entire first signal line 12 and the second signal line 13 can extend almost to the point that contacts with the to-be-tested device.

In this embodiment, the first upper grounding layer 141, the second upper grounding layer 142, and the lower grounding layer 16 do not cover the pin body portion 123B of the first pogo pin 123 and both sides of the pin body portion 133B of the second pogo pin 133 in a length direction. Therefore, when the probe assembly 100 of this embodiment is used to perform a differential signal test on the printed circuit board, the test signal will not be coupled to the grounding layers on both sides of the first pogo pin 123 and the second pogo pin 133, so that the generation of a radiation resonance is effectively avoided.

In some embodiments, the first upper grounding layer 141, the second upper grounding layer 142, and the lower grounding layer 16 are commonly-grounded. In some embodiments, the upper surface 111 of the dielectric layer 11 further includes a third upper grounding region 111G3 that is located between the first tail section 122 and the second tail section 132. The probe assembly 100 further includes a third upper grounding layer 143 that is disposed in the third upper grounding region 111G3, and the first upper grounding layer 141, the second upper grounding layer 142, the third upper grounding layer 143, and the lower grounding layer 16 are commonly-grounded.

In some embodiments, the dielectric layer 11 includes a plurality of conductive vias 119, where at least one of the conductive vias 119 is electrically connected to the first upper grounding layer 141 and the lower grounding layer 16, at least one of the conductive vias 119 is electrically connected to the second upper grounding layer 142 and the lower grounding layer 16, and at least one of the conductive vias 119 is electrically connected to the third upper grounding layer 143 and the lower grounding layer 16. In this way, the first upper grounding layer 141, the second upper grounding layer 142, the third upper grounding layer 143, and the lower grounding layer 16 can be commonly-grounded through the conductive via 119.

In some embodiments, the first head section 121 extends in a first direction (for example, an x-axis direction in the figure) and has a length L1. The first upper blank region 111A has a width W1 in the first direction (the x-axis direction), and the first lower blank region 112A has a width W2 in the first direction (the x-axis direction). In some embodiments, the width W1 is substantially equal to the width W2, and the width W1 and the width W2 are substantially equal to the length L1. In addition, in some embodiments, the second head section 131 extends in the first direction (the x-axis direction) and has a length L2. The second upper blank region 111B has a width W3 in the first direction (the x-axis direction), and the second lower blank region 112B has a width W4 in the first direction (the x-axis direction). In some embodiments, the width W3 is substantially equal to the width W4, and the width W3 and the width W4 are substantially equal to the length L2.

In some embodiments, a projection of the first upper blank region 111A in a normal direction of the upper surface 111 fully overlaps with a projection of the first lower blank region 112A in a normal direction of the lower surface 112, and a projection of the second upper blank region 111B in the normal direction of the upper surface 111 also overlaps with a projection of the second lower blank region 112B in the normal direction of the lower surface 112. It should be particularly noted that there is a degree of machining error in all machining procedures, and due to the machining error, the projection of the first upper blank region 111A in the normal direction of the upper surface 111 may be slight-different from the projection of the first lower blank region 112A in the normal direction of the lower surface 112. The foregoing difference is merely due to the machining error rather than different designs, and therefore the projections are regarded as being overlapped for a person with ordinary knowledge in the art. Similarly, the projection of the second upper blank region 111B in the normal direction of the upper surface 111 likewise overlaps with the projection of the second lower blank region 112B in the normal direction of the lower surface 112.

Figure 3:
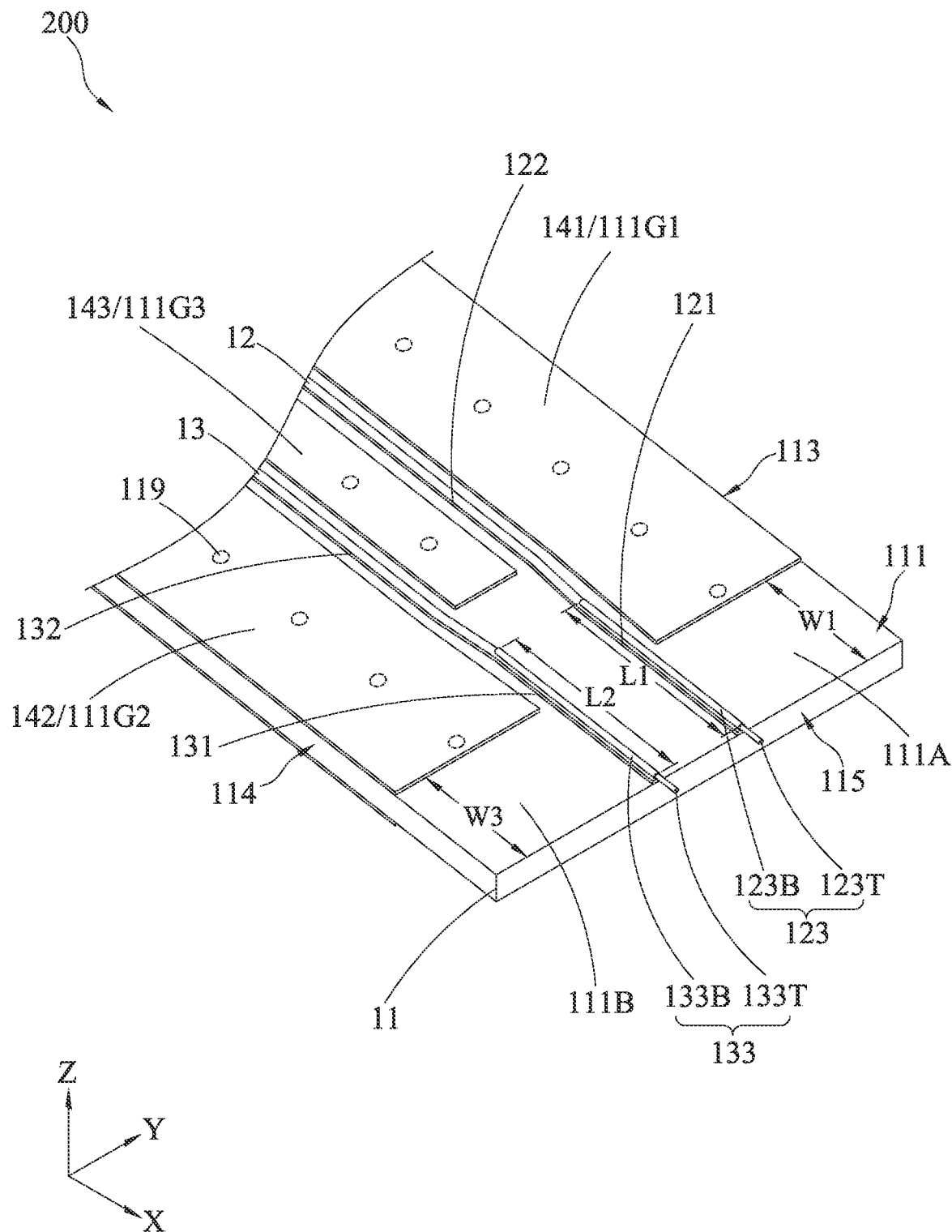
FIG. 3 is a schematic perspective view (I) according to a second embodiment of the present invention.
Figure 4:
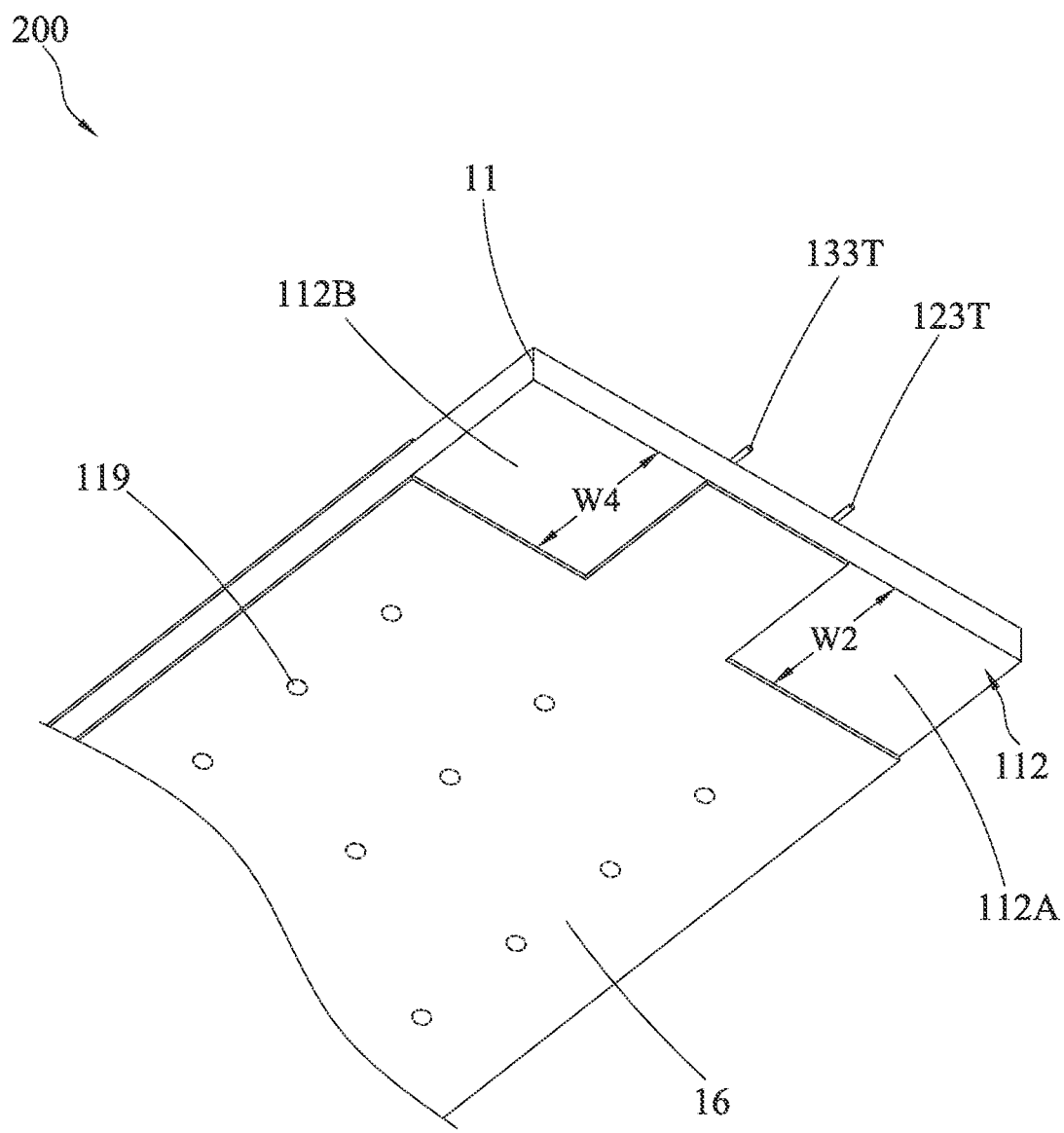
FIG. 4 is a schematic perspective view (II) according to a second embodiment of the present invention.
Figure 9:
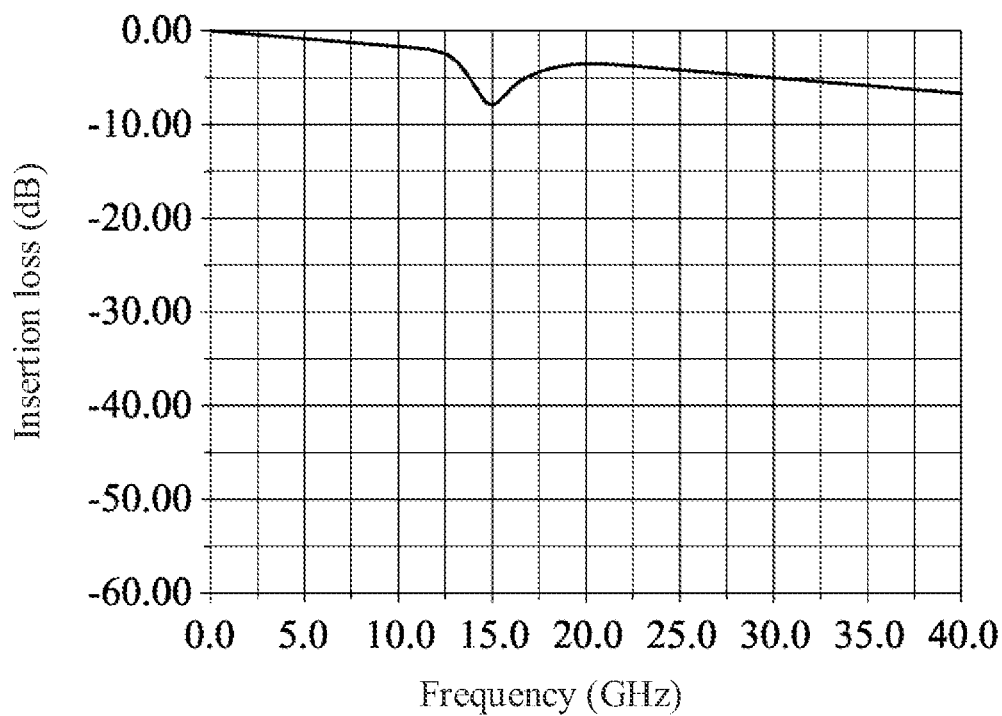
FIG. 9 is a curve diagram of an insertion loss of a probe assembly relative to a test frequency when a width W1/W2/W3/W4 of a blank region or a first distance D1/second distance D2/third distance D3/fourth distance D4 between an edge of each upper grounding layer and lower grounding layer and an end surface of a protruding portion is 0 mm.
Figure 10:
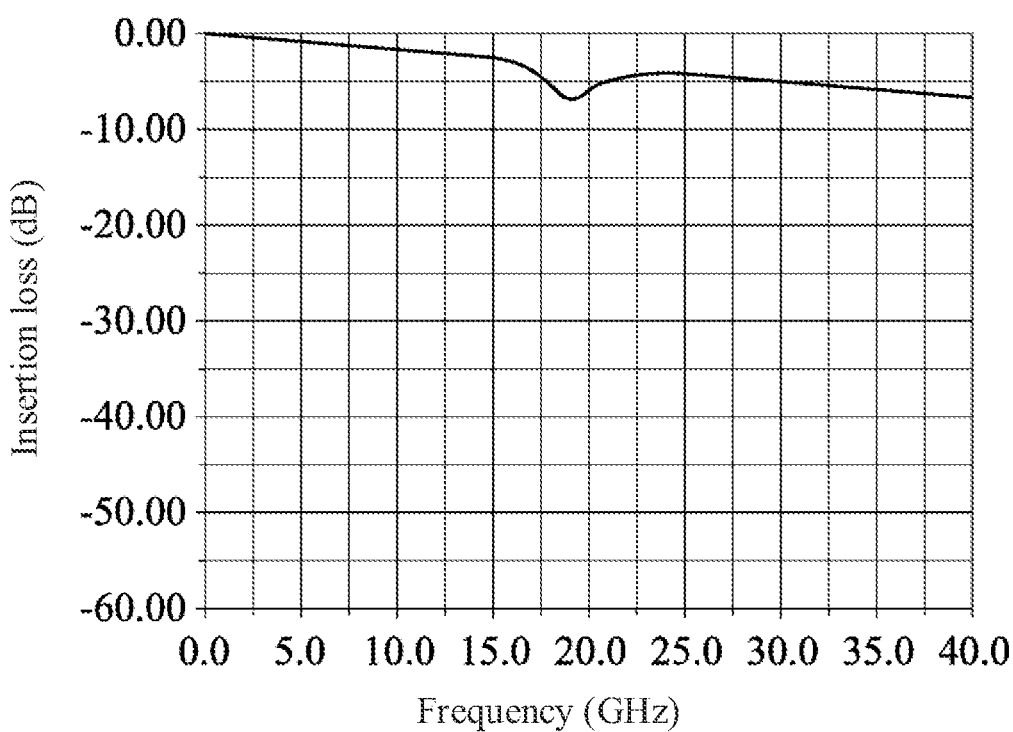
FIG. 10 is a curve diagram of an insertion loss of a probe assembly relative to a test frequency when a width W1/W2/W3/W4 of a blank region or a first distance D1/second distance D2/third distance D3/fourth distance D4 is 0.5 mm.
Figure 11:
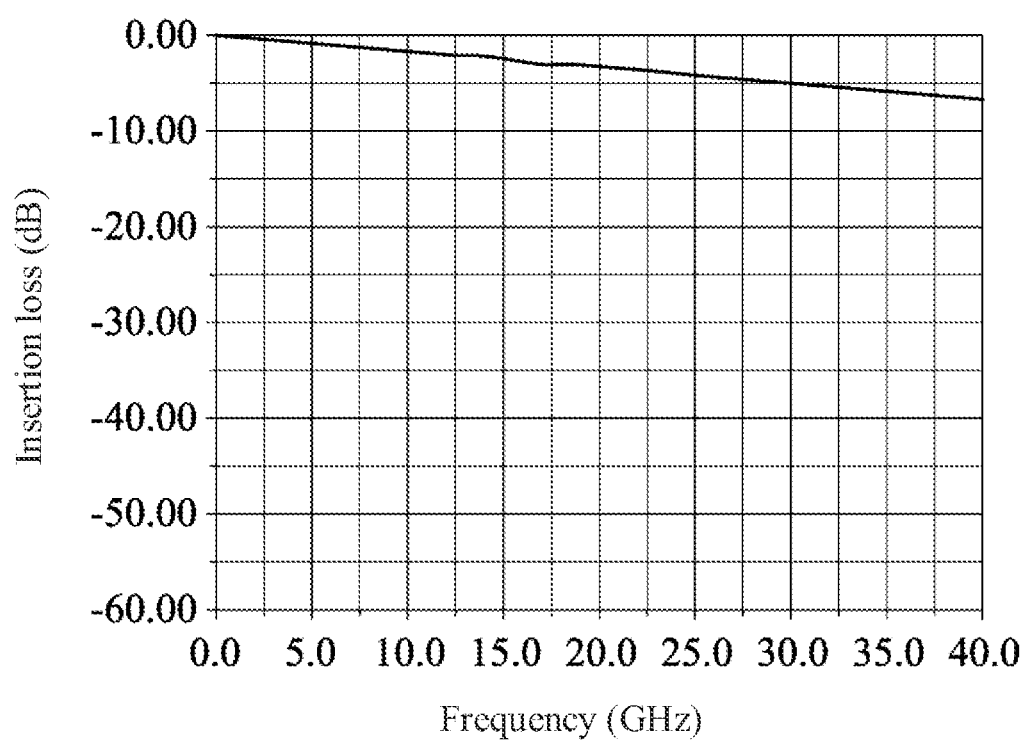
FIG. 11 is a curve diagram of an insertion loss of a probe assembly relative to a test frequency when a width W1/W2/W3/W4 of a blank region or a first distance D1/second distance D2/third distance D3/fourth distance D4 is 0.8 mm.

FIG. 3 and FIG. 4 are respectively a schematic perspective view (I) and a schematic perspective view (II) according to a second embodiment of the present invention, which illustrate a probe assembly 200. In this embodiment, a length of the pin body portion 123B of the first pogo pin 123 is equal to the length L1 of the first head section 121 in the x-axis direction, but the width W1 of the first upper blank region 111A in the x-axis direction and the width W2 of the first lower blank region 112A in the x-axis direction are less than the length L1. In addition, the length of the pin body portion 133B of the second pogo pin 133 is equal to the length L2 of the second head section 131 in the x-axis direction, but the width W3 of the second upper blank region 111B in the x-axis direction and the width W4 of the second lower blank region 112B in the x-axis direction are less than the length L2. FIG. 9 to FIG. 11 are respectively curve diagrams of an insertion loss relative to a test frequency when W1=W2=W3=W4=0 mm, W1=W2=W3=W4=0.5 mm, and W1=W2=W3=W4=0.8 mm. As shown in FIG. 9, when W1=W2=W3=W4=0 mm, which is equivalent to that both sides of the pin body portion 123B of the first pogo pin 123 and the pin body portion 133B of the second pogo pin 133 are grounding layers, at this time there will be an energy loss due to the foregoing radiation resonance near a specific frequency (15 GHz shown in the figure). As shown in FIG. 10, when W1=W2=W3=W4=0.5 mm, the grounding layers on both sides of the pin body portion 123B of the first pogo pin 123 and the pin body portion 133B of the second pogo pin 133 are reduced, and the radiation resonance phenomenon is eliminated, so that the energy loss near the specific frequency is greatly reduced. Further, as shown in FIG. 11, when W1, W2, W3, and W4 are further increased from 0.5 mm to 0.8 mm, the grounding layers on both sides of the pin body portion 123B of the first pogo pin 123 and the pin body portion 133B of the second pogo pin 133 are further reduced, at this time, the influence of the radiation resonance approaches to zero, and there is no obvious energy loss found in all test frequencies. Similarly, compared with the foregoing form in which W1=W2=W3=W4=0.8 mm, the grounding layers on both sides of the first pogo pin 123 and the second pogo pin 133 of the probe assembly 100 in the first embodiment are further reduced, and the influence of the radiation resonance also approaches to zero, so that there is no obvious energy loss in all test frequencies in the curve diagram of the insertion loss of the probe assembly 100 relative to the test frequency in the first embodiment, which is alternatively shown in FIG. 11. It should be particularly noted that, in this embodiment, merely the influence of the widths W1, W2, W3, and W4 of the first upper blank region 111A, the first lower blank region 112A, the second upper blank region 111B, and the second lower blank region 112B on the radiation resonance should be particularly noted, and there is no need to particularly consider the length of the pin body portion 123B of the first pogo pin 123 and the pin body portion 133B of the second pogo pin 133.

It should be particularly noted herein that, W1=W2=W3=W4 in the foregoing embodiment is merely a specific instance, and W1, W2, W3, and W4 may be different from each other. The effect of avoiding the radiation resonance can be achieved as long as W1≥0.8 mm, W2≥0.8 mm, W3≥0.8 mm, and W4≥0.8 mm.

Figure 5:
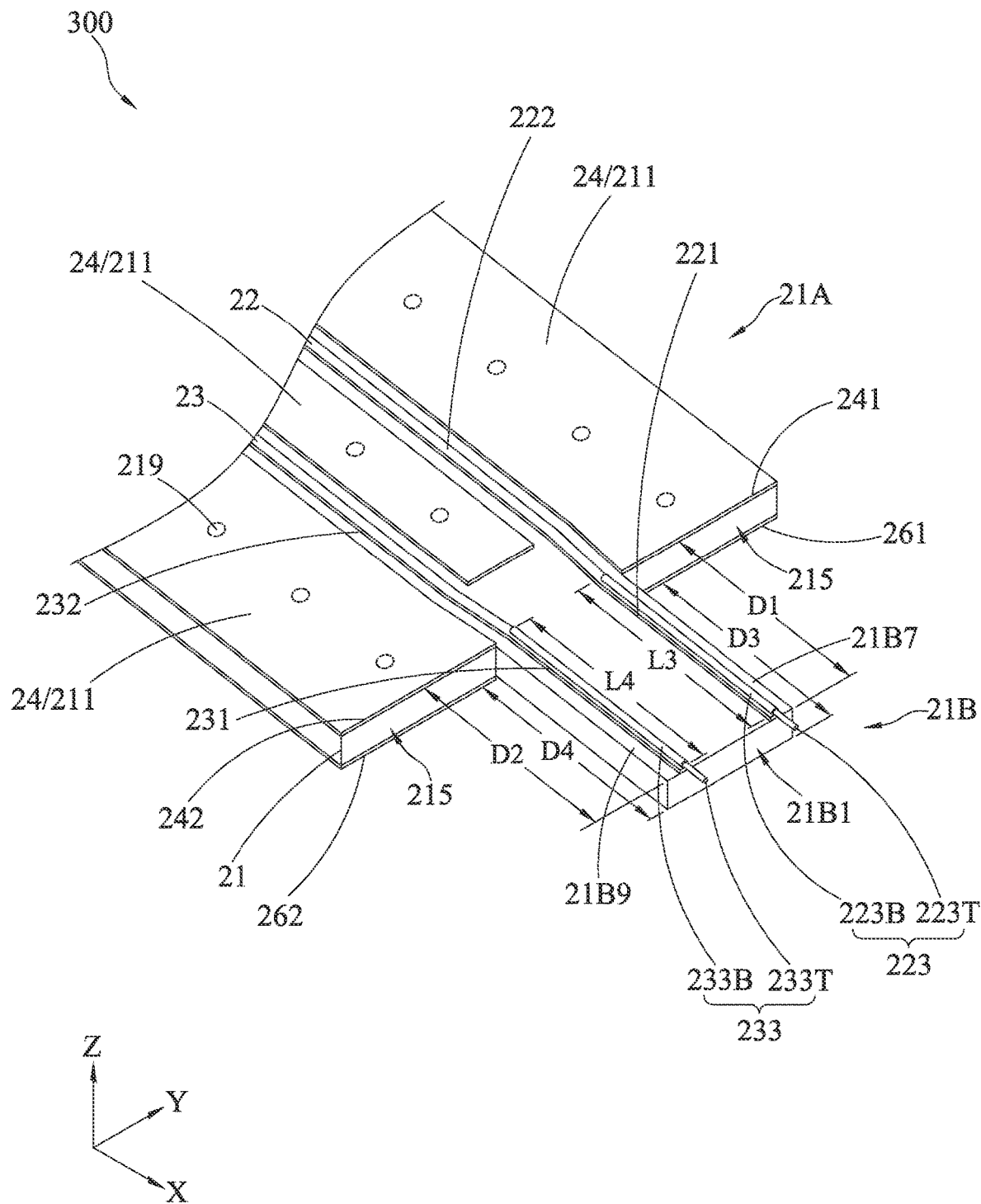
FIG. 5 is a schematic perspective view (I) according to a third embodiment of the present invention.
Figure 6:
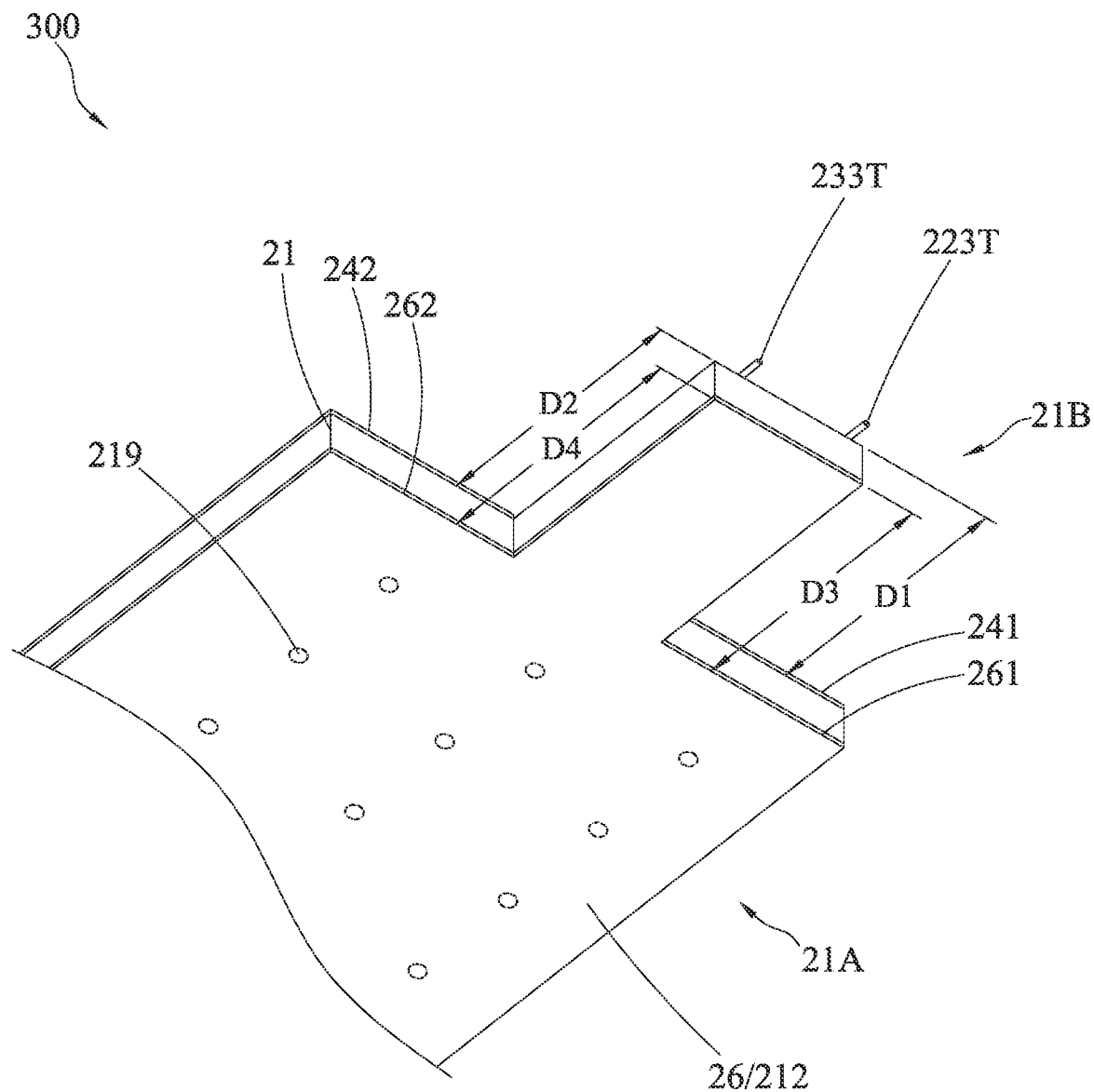
FIG. 6 is a schematic perspective view (II) according to a third embodiment of the present invention.

FIG. 5 and FIG. 6 are respectively a schematic perspective view (I) and a schematic perspective view (II) according to a third embodiment of the present invention, which illustrate a probe assembly 300. The probe assembly 300 includes a dielectric layer 21, a first signal line 22, a second signal line 23, a first pogo pin 223, a second pogo pin 233, an upper grounding layer 24, and lower grounding layer 26. The probe assembly 300 is similarly applied to perform a differential signal test on high-speed signal transmission lines of a printed circuit board, and is particularly applied to a printed circuit board of which test contacts include no grounding point.

As shown in the figure, the dielectric layer 21 includes an upper surface 211, a lower surface 212, and the dielectric layer 21 may be divided into a body portion 21A and a protruding portion 21B. The body portion 21A includes a side 215. The protruding portion 21B extends and protrudes from the side 215 of the body portion 21A in the first direction (for example, the x-axis direction in the figure) toward the direction away from the side 215. In some embodiments, the protruding portion 21B extends and protrudes from a center of the side 215 of the body portion 21A in the first direction (the x-axis direction) toward the direction away from the side 215.

The first signal line 22 is disposed on the upper surface 211 of the dielectric layer 21, where the first signal line 22 includes a first head section 221 and a first tail section 222. The first head section 221 is disposed at the protruding portion 21B of the dielectric layer 21, and the first tail section 222 is disposed at the body portion 21A of the dielectric layer 21. One end of the first head section 221 is connected to the first tail section 222, and an other end of the first head section 221 points to an end surface 21B1 of the protruding portion 21B.

The second signal line 23 is disposed on the upper surface 211 of the dielectric layer 21 and is spaced apart from the first signal line 22. The second signal line 23 includes a second head section 231 and a second tail section 232, where the second head section 231 is disposed at the protruding portion 21B of the dielectric layer 21, and the second tail section 232 is disposed at the body portion 21A of the dielectric layer 21. One end of the second head section 231 is connected to the second tail section 232, and an other end of the second head section 231 points to the end surface 21B1 of the protruding portion 21B.

The first pogo pin 223 is disposed at the first head section 221 of the first signal line 22. The first pogo pin 223 includes a pin body portion 223B and a telescopic portion 223T. The telescopic portion 223T is located at one end of the pin body portion 223B, and the telescopic portion 223T protrudes from the end surface 21B1 of the protruding portion 21B of the dielectric layer 21 in the free state. The second pogo pin 233 is disposed at the second head section 231 of the second signal line 23. The second pogo pin 233 includes a pin body portion 233B and a telescopic portion 233T. The telescopic portion 233T is located at one end of the pin body portion 233B, and the telescopic portion 233T protrudes from the end surface 21B1 of the protruding portion 21B of the dielectric layer 21 in the free state.

The upper grounding layer 24 is disposed at the upper surface of the body portion 21A of the dielectric layer 21, and the lower grounding layer 26 is disposed on the lower surface of the body portion 21A and the lower surface of the protruding portion 21B of the dielectric layer 21. In this embodiment, impedance matching of the entire first signal line 22 and the second signal line 23 can extend almost to the point that contacts with the to-be-tested device.

As shown in FIG. 5, the probe assembly 300 includes three upper grounding layers 24. The three upper grounding layers 24 are respectively located between the first tail section 222 of the first signal line 22 and an edge of the dielectric layer 21 that is adjacent to the first signal line 22, between the first tail section 222 of the first signal line 22 and the second tail section 232 of the second signal line 23, and between the second tail section 232 of the second signal line 23 and an edge of the dielectric layer 21 that is adjacent to the second signal line 23. In some embodiments, the upper grounding layer 24 and the lower grounding layer 26 are commonly-grounded. In some embodiments, the dielectric layer 21 further includes at least one conductive via 219, and the conductive via 219 is electrically connected to the upper grounding layer 24 and the lower grounding layer 26. In this way, the upper grounding layer 24 and the lower grounding layer 26 can be commonly-grounded through the conductive via 219.

In some embodiments, the pin body portion 223B of the first pogo pin 223 and the pin body portion 233B of the second pogo pin 233 respectively have a length L3 and a length L4 in the first direction (the x-axis direction). The upper grounding layer 24 includes a first edge 241 and a second edge 242. The first edge 241 and the second edge 242 are respectively located on both sides of the protruding portion 21B of the dielectric layer 21 and are adjacent to the side 215 of the body portion 21A of the dielectric layer 21. The lower grounding layer 26 includes a third edge 261 and a fourth edge 262. The third edge 261 and the fourth edge 262 are respectively located on both sides of the protruding portion 21B of the dielectric layer 21 and are adjacent to the side 215 of the body portion 21A of the dielectric layer 21. There is a first distance D1 in the first direction (the x-axis direction) between the first edge 241 and the end surface 21B1 of the protruding portion 21B, there is a second distance D2 in the first direction (the x-axis direction) between the second edge 242 and the end surface 21B1 of the protruding portion 21B, there is a third distance D3 in the first direction (the x-axis direction) between the third edge 261 and the end surface 21B1 of the protruding portion 21B, and there is a fourth distance D4 in the first direction (the x-axis direction) between the fourth edge 262 and the end surface 21B1 of the protruding portion 21B, where D1=D2=D3=D4. In some embodiments, L3=L4=D1=D2=D3=D4.

In some embodiments, the body portion 21A and the protruding portion 21B are formed by machining a single piece of the dielectric layer. For example, two corners of a same side of a rectangular dielectric layer are L-shaped cut. After the two corners are cut, the dielectric layer portion located between the two cut portions is the protruding portion 21B, and the dielectric layer portion outside of the protruding portion 21B is the body portion 21A.

Figure 7:
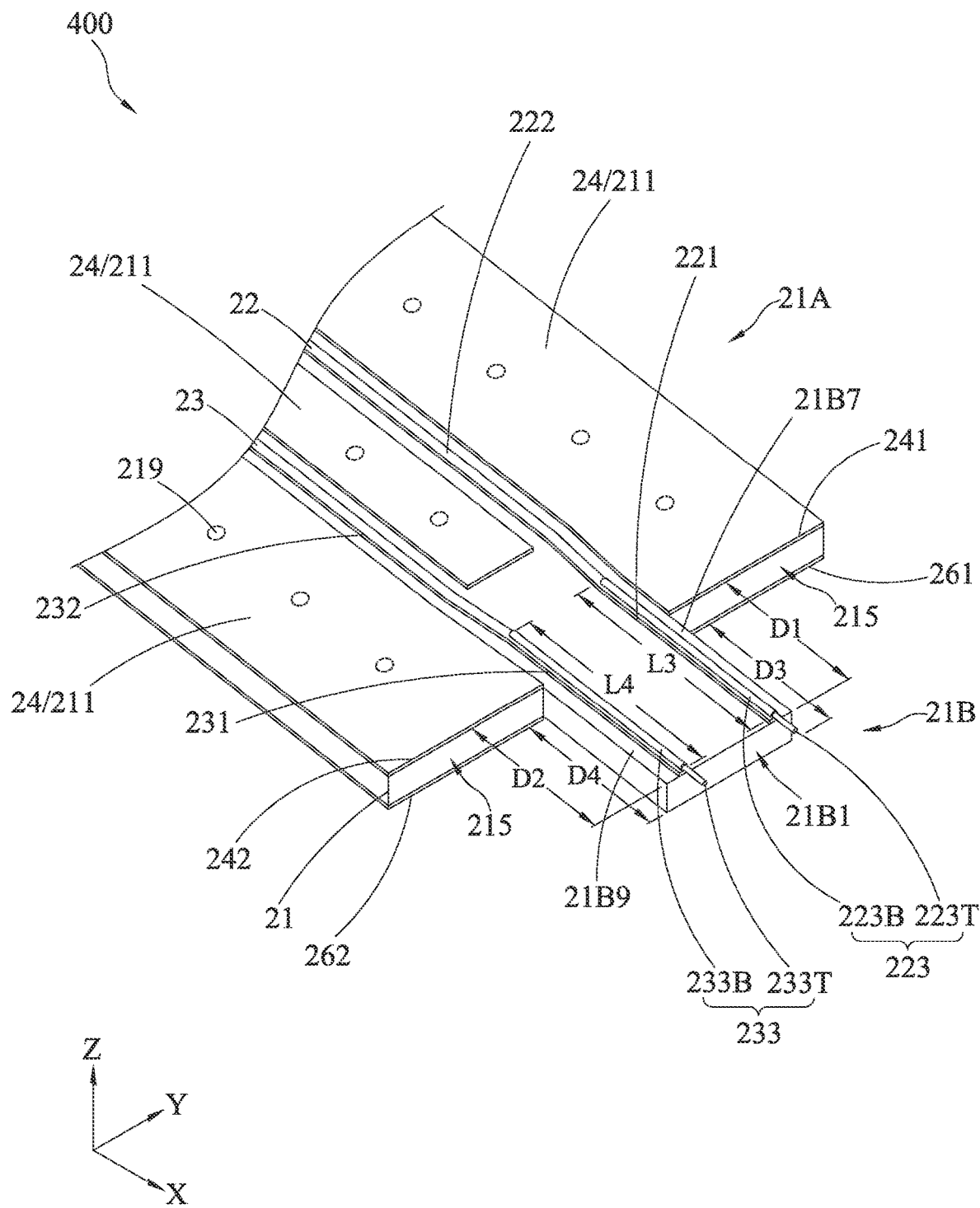
FIG. 7 is a schematic perspective view (I) according to a fourth embodiment of the present invention.
Figure 8:
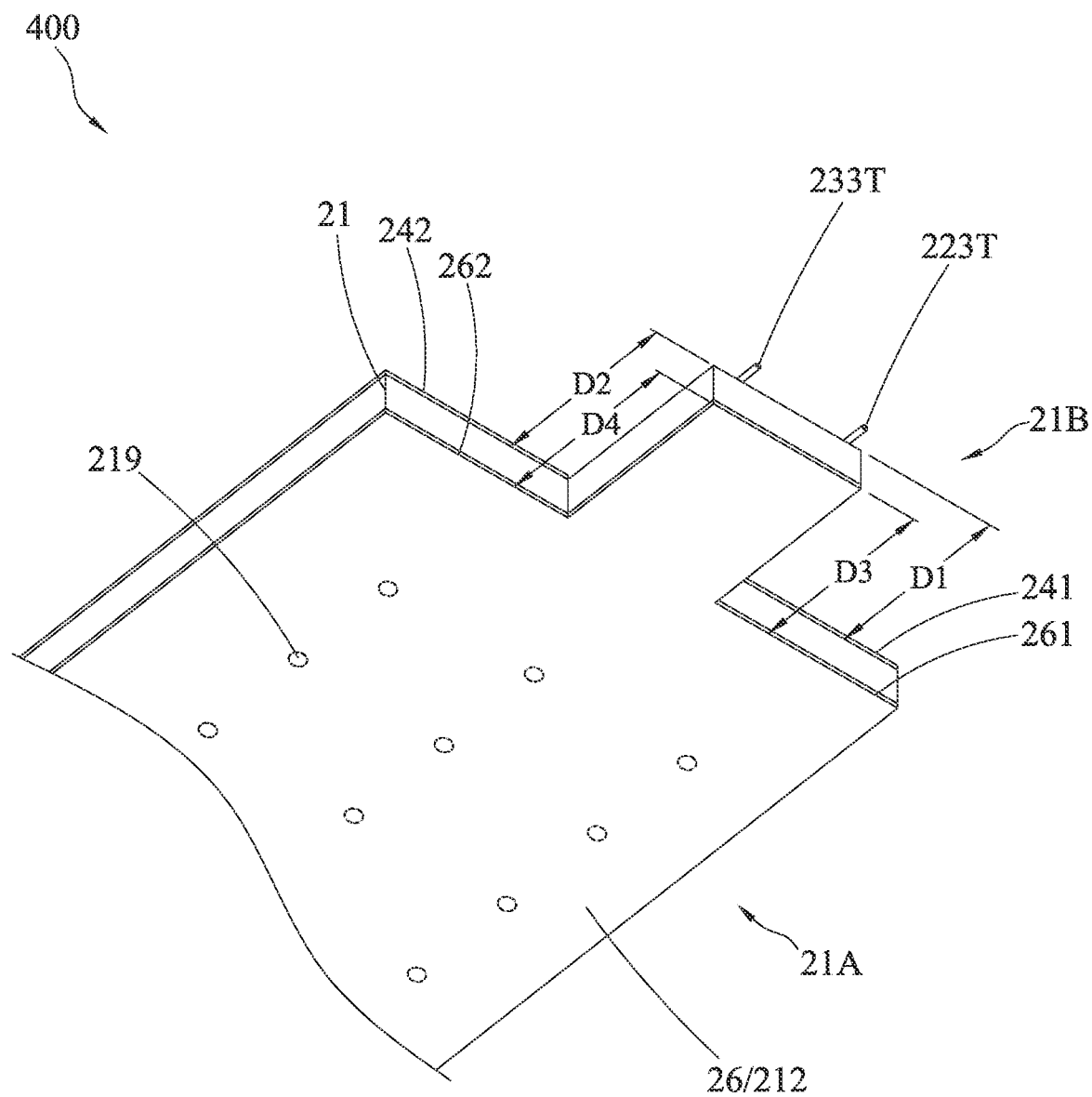
FIG. 8 is a schematic perspective view (II) according to a fourth embodiment of the present invention.

FIG. 7 and FIG. 8 are respectively a schematic perspective view (I) and a schematic perspective view (II) according to a fourth embodiment of the present invention, which illustrate a probe assembly 400. The main difference between this embodiment and the third embodiment lies in that D1, D2, D3, and D4 are less than the length L3 of the pin body portion 223B of the first pogo pin 223 and/or the length L4 of the pin body portion 233B of the second pogo pin 233. FIG. 9 to FIG. 11 are respectively curve diagrams of the insertion loss relative to the test frequency when D1=D2=D3=D4=0 mm, D1=D2=D3=D4=0.5 mm, and D1=D2=D3=D4=0.8 mm. As shown in FIG. 9, when D1=D2=D3=D4=0 mm, both sides of the pin body portion 223B of the first pogo pin 223 and the pin body portion 233B of the second pogo pin 233 are grounding layers, at this time there will be an energy loss due to the foregoing radiation resonance near the specific frequency (15 GHz shown in the figure). As shown in FIG. 10, when D1=D2=D3=D4=0.5 mm, the grounding layers on both sides of the pin body portion 223B of the first pogo pin 223 and the pin body portion 233B of the second pogo pin 233 are reduced, and the radiation resonance phenomenon is eliminated, so that the energy loss near the specific frequency greatly is reduced. Further, as shown in FIG. 11, when D1, D2, D3, and D4 are further increased from 0.5 mm to 0.8 mm, the grounding layers on both sides of the pin body portion 223B of the first pogo pin 223 and the pin body portion 233B of the second pogo pin 233 are further reduced, at this time, the influence of the radiation resonance approaches to zero, and there is no obvious energy loss in all test frequencies. Similarly, compared with the foregoing form in which D1=D2=D3=D4=0.8 mm, the grounding layers on both sides of the pin body portion 223B of the first pogo pin 223 and the pin body portion 233B of the second pogo pin 233 of the probe assembly 300 in the third embodiment are further reduced, and the influence of the radiation resonance alternatively approaches to zero, so that there is no obvious energy loss found in all test frequencies in the curve diagram of the insertion loss of the probe assembly 300 in the third embodiment relative to the test frequency, which is alternatively shown in FIG. 11. It should be particularly noted that, in this embodiment, merely a value of D1=D2=D3=D4 should be noted, and there is no need to particularly consider the length of the pin body portion 223B of the first pogo pin 223 and the pin body portion 233B of the second pogo pin 233.

It should be particularly noted herein that, D1=D2=D3=D4 in the foregoing embodiment is merely a specific instance, D1, D2, D3, and D4 may be different from each other, and the effect of avoiding the radiation resonance can be achieved as long as D1≥0.8 mm, D2≥0.8 mm, D3≥0.8 mm, and D4≥0.8 mm. In addition, a distance of the dielectric layer 21 in the first direction (the x-axis direction) between the side 215 of the body portion 21A and the end surface 21B1 of the protruding portion 21B is not limited to being equal to D1, D2, D3, and D4. In some embodiments, the distance between the side 215 and the end surface 21B1 may be less than D1, D2, D3, and D4, and it still can be considered that the first edge 241 and the second edge 242 are adjacent to the side 215 of the body portion 21A of the dielectric layer 21, and the third edge 261 and the fourth edge 262 are adjacent to the side 215 of the body portion 21A of the dielectric layer 21.

Referring to FIG. 5 and FIG. 7, in some embodiments, considering the convenience of machining and mechanical strength of the protruding portion 21B, a local area 21B7 is reserved between the pin body portion 223B of the first pogo pin 223 and a side edge of the protruding portion 21B, and a local area 21B9 is further reserved between the pin body portion 233B of the second pogo pin 233 and the side edge of the protruding portion 21B. In some embodiments, provided that the machining accuracy permits and the mechanical strength meets the actual application requirements, the local area 21B7 and the local area 21B9 may not be reserved.

In some embodiments, the upper grounding layer and the lower grounding layer can be respectively formed on two surfaces of a rectangular dielectric layer, and the first signal line 22, the second signal line 23, the first pogo pin 223, and the second pogo pin 233 are formed on one surface of the dielectric layer, and then the two corners of a same side of the dielectric layer can be L-shaped cut to remove the dielectric layer and the grounding layer at the two corners, so that the probe assembly 200 can be formed.

Again, it should be emphasized herein that the probe assembly of the present invention is completely a new design, that is, the probe assembly includes no grounding probe, so that the probe assembly is applicable for a to-be-tested device of which test contacts include no grounding point. In addition, the grounding layers (metal layer) on both sides of the first pogo pin and the second pogo pin that are used to provide a differential signal in the present invention is appropriately reduced, so that during the test, the test signal will not be coupled to the grounding layers on both sides and generate the radiation resonance. It should be particularly noted that the grounding layers (metal layer) on both sides of the first pogo pin and the second pogo pin only need to be appropriately reduced, so that the influence of the radiation resonance can be avoided, and there is no correlation between the radiation resonance and the length of the first pogo pin and the second pogo pin.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A probe assembly, comprising:
a dielectric layer, comprising an upper surface, a lower surface, a first side, a second side, and a third side, wherein the first side and the second side are opposite to each other, the third side is located between the first side and the second side, the upper surface comprises a first upper blank region, a second upper blank region, a first upper grounding region, and a second upper grounding region, and the lower surface comprises a first lower blank region and a second lower blank region;
a first signal line, disposed on the upper surface, wherein the first signal line comprises a first head section and a first tail section, one end of the first head section is connected to the first tail section, an other end of the first head section points to the third side, the first upper blank region and the first lower blank region are located between the first head section and the first side, and the first upper grounding region is located between the first tail section and the first side;
a second signal line, disposed on the upper surface and spaced apart from the first signal line, wherein the second signal line comprises a second head section and a second tail section, one end of the second head section is connected to the second tail section, an other end of the second head section points to the third side, the second upper blank region and the second lower blank region are located between the second head section and the second side, and the second upper grounding region is located between the second tail section and the second side;

a first pogo pin, disposed at the first head section, wherein the first pogo pin comprises a pin body portion and a telescopic portion;

a second pogo pin, disposed at the second head section, wherein the second pogo pin comprises a pin body portion and a telescopic portion;

a first upper grounding layer, disposed in the first upper grounding region;

a second upper grounding layer, disposed in the second upper grounding region; and a lower grounding layer, disposed on the lower surface without passing through the first lower blank region and the second lower blank region.

2. The probe assembly according to claim 1, wherein the first upper grounding layer and the second upper grounding layer and the lower grounding layer are commonly-grounded.

3. The probe assembly according to claim 2, wherein the dielectric layer further comprises a third upper grounding region that is located between the first tail section and the second tail section, and the probe assembly further comprises a third upper grounding layer that is disposed in the third upper grounding region, wherein the first upper grounding layer, the second upper grounding layer, the third upper grounding layer and the lower grounding layer are commonly-grounded.

4. The probe assembly according to claim 3, wherein the dielectric layer further comprises a plurality of conductive vias, at least one of the conductive vias is electrically connected to the first upper grounding layer and the lower grounding layer, at least one of the conductive vias is electrically connected to the second upper grounding layer and the lower grounding layer, and at least one of the conductive vias is electrically connected to the third upper grounding layer and the lower grounding layer.

5. The probe assembly according to claim 1, wherein the first upper blank region has a width W1 in a first direction, the first lower blank region has a width W2 in the first direction, the second upper blank region has a width W3 in the first direction, and the second lower blank region has a width W4 in the first direction, wherein W1≥0.8 mm, W2≥0.8 mm, W3≥0.8 mm, and W4≥0.8 mm.

6. The probe assembly according to claim 1, wherein a projection of the first upper blank region in a normal direction of the upper surface overlaps with a projection of the first lower blank region in a normal direction of the lower surface, and a projection of the second upper blank region in the normal direction of the upper surface overlaps with a projection of the second lower blank region in the normal direction of the lower surface.

7. A probe assembly, comprising:
a dielectric layer, comprising a body portion and a protruding portion, wherein the protruding portion protrudes from a side of the body portion in the first direction toward the direction away from the side;

a first signal line, disposed on the upper surface of the dielectric layer, wherein the first signal line comprises a first head section and a first tail section, the first head section is disposed at the protruding portion, the first tail section is disposed at the body portion, one end of the first head section is connected to the first tail section, and an other end of the first head section points to an end surface of the protruding portion;

a second signal line, disposed on the upper surface of the dielectric layer and spaced apart from the first signal line, wherein the second signal line comprises a second head section and a second tail section, the second head section is disposed at the protruding portion, the second tail section is disposed at the body portion, one end of the second head section is connected to the second tail section, and an other end of the second head section points to the end surface;

a first pogo pin, disposed at the first head section, wherein the first pogo pin comprises a pin body portion and a telescopic portion;

a second pogo pin, disposed at the second head section, wherein the second pogo pin comprises a pin body portion and a telescopic portion;

an upper grounding layer, disposed on the upper surface of the body portion; and a lower grounding layer, disposed on the lower surface of the body portion and the lower surface of the protruding portion.

8. The probe assembly according to claim 7, wherein the upper grounding layer and the lower grounding layer are commonly-grounded.

9. The probe assembly according to claim 8, wherein the dielectric layer further comprises a conductive via, and the conductive via is electrically connected to the upper grounding layer and the lower grounding layer.

10. The probe assembly according to claim 7, wherein the upper grounding layer comprises a first edge and a second edge, and the first edge and the second edge are respectively located on both sides of the protruding portion and are adjacent to the side of the body portion; the lower grounding layer comprises a third edge and a fourth edge, and the third edge and the fourth edge are respectively located on both sides of the protruding portion and are adjacent to the side of the body portion; and there is a first distance D1 in the first direction between the first edge and the end surface, there is a second distance D2 in the first direction between the second edge and the end surface, there is a third distance D3 in the first direction between the third edge and the end surface, and there is a fourth distance D4 in the first direction between the fourth edge and the end surface, wherein D1≥0.8 mm, D2≥0.8 mm, D3≥0.8 mm, and D4≥0.8 mm.

* * * * *